US012230339B2

(12) United States Patent
Chi

(10) Patent No.: US 12,230,339 B2
(45) Date of Patent: Feb. 18, 2025

(54) ELECTRONIC DEVICE AND DRIVING METHOD THEREOF

(71) Applicant: ChangXin Memory Technologies, Inc., Hefei (CN)

(72) Inventor: Sungsoo Chi, Hefei (CN)

(73) Assignee: ChangXin Memory Technologies, Inc., Hefei (CN)

( * ) Notice: Subject to any disclaimer, the term of this patent is extended or adjusted under 35 U.S.C. 154(b) by 0 days.

(21) Appl. No.: 18/036,036

(22) PCT Filed: Jul. 12, 2022

(86) PCT No.: PCT/CN2022/105237
§ 371 (c)(1),
(2) Date: May 9, 2023

(87) PCT Pub. No.: WO2023/173636
PCT Pub. Date: Sep. 21, 2023

(65) Prior Publication Data
US 2024/0339164 A1    Oct. 10, 2024

(30) Foreign Application Priority Data

Mar. 17, 2022  (CN) .......................... 202210266447.8

(51) Int. Cl.
  *G11C 17/16*  (2006.01)
  *G11C 7/08*   (2006.01)
  *G11C 17/18*  (2006.01)
(52) U.S. Cl.
  CPC ............. *G11C 17/165* (2013.01); *G11C 7/08* (2013.01); *G11C 17/18* (2013.01)

(58) Field of Classification Search
  CPC .............................. G11C 17/165; G11C 17/16
  (Continued)

(56) References Cited

U.S. PATENT DOCUMENTS 7,504,877 B1 *  3/2009  Voogel ..................... H02M 3/07
                                                            363/59
8,638,591 B2 *  1/2014  Saripalli ............... G11C 11/412
                                                            365/72

(Continued)

FOREIGN PATENT DOCUMENTS

KR       10-0811375 B1     2/2008

*Primary Examiner* — Muna A Techane
(74) *Attorney, Agent, or Firm* — Kilpatrick Townsend & Stockton LLP

(57) ABSTRACT

The present disclosure provides an electronic device and a driving method. The electronic device comprises: a sensitivity amplifier and a voltage adjustment circuit. The sensitivity amplifier includes: a first P-type transistor, a second P-type transistor, a first N-type transistor, a second N-type transistor, and a control circuit. The control circuit is connected to the third node, the fourth node, and a preset voltage terminal. A first control signal terminal responds to the signal of the first control signal terminal to connect the preset voltage terminal and the third node and the fourth node. The preset voltage terminal inputs a preset voltage signal. The electronic device write a preset voltage signal of a suitable size to the sensitivity amplifier through the voltage adjustment circuit, so that the sensitivity amplifier has an appropriate voltage difference between the bit line and the complementary bit line during offset elimination.

17 Claims, 10 Drawing Sheets

(58) Field of Classification Search
USPC .......................................................... 365/244
See application file for complete search history.

(56) References Cited

U.S. PATENT DOCUMENTS

| | | | | |
|---|---|---|---|---|
| 9,858,217 | B1* | 1/2018 | Marfatia | G11C 7/22 |
| 9,922,702 | B1* | 3/2018 | Shanmugam | G11C 11/412 |
| 11,049,552 | B1* | 6/2021 | Raj | G11C 11/4091 |
| 2009/0168490 | A1* | 7/2009 | Madan | G11C 11/2257 |
| | | | | 257/295 |
| 2013/0039127 | A1* | 2/2013 | Wang | G11C 14/0054 |
| | | | | 365/185.08 |
| 2013/0188434 | A1* | 7/2013 | Puckett | G11C 11/419 |
| | | | | 365/189.16 |
| 2021/0279036 | A1* | 9/2021 | Li | H04N 19/42 |

\* cited by examiner

ELECTRONIC DEVICE AND DRIVING METHOD THEREOF

CROSS REFERENCE TO RELATED APPLICATIONS

This application claims the priority of the Chinese patent application No. 202210266447.8 entitled "Electronic Device and Driving Method Thereof" field on Mar. 17, 2022, and the contents of which are incorporated herein by reference in its entirety.

TECHNICAL FIELD

The present disclosure relates to the field of storage technology, in particular to an electronic device and its driving method.

BACKGROUND

In the related art, the sensitivity amplifier usually includes two P-type transistors and two N-type transistors, and the two P-type transistors and two N-type transistors are used to amplify the signal of the bit line and the complementary bit line.

Semiconductor devices constituting a sensitivity amplifier may have different device characteristics (e.g., threshold voltage) due to process variations, temperature, etc. Different device characteristics will cause the sensitivity amplifier to generate offset noise, and the offset noise will reduce the effective read margin of the sensitivity amplifier, resulting in a decrease in the accuracy of data readout and degrading the data performance of the memory.

It should be noted that the information disclosed in the above background technology section is only used to enhance the understanding of the background of the present disclosure, and therefore may include information that does not constitute prior art known to those of ordinary skill in the art.

SUMMARY

According to one embodiment of the present disclosure, an electronic device is provided, and the electronic device includes: a sensitivity amplifier and a voltage regulation circuit. The sensitivity amplifier includes: a first P-type transistor, a second P-type transistor, a first N-type transistor, a second N-type transistor, and a control circuit. The first terminal of the first P-type transistor is connected to the first node, and the second terminal is connected to the first node connected to the readout bit line, the gate is connected to the third node; the first terminal of the second P-type transistor is connected to the first node, the second terminal is connected to the complementary readout bit line, and the gate is connected to the fourth node; the first terminal of the first N-type transistor is connected to the second node, the second terminal is connected to the readout bit line, and the gate is connected to the bit line; the first terminal of the second N-type transistor is connected to the second node, and the second terminal is connected to the complementary readout bit line, the gate is connected to the complementary bit line; the control circuit is connected to the third node, the fourth node, the preset voltage terminal, and the first control signal terminal, and is used to connect to the signal in response to the signal from the first control signal terminal to connect the preset voltage terminal, the third node, and the fourth node; the voltage regulation circuit is connected to the preset voltage terminal and the adjustment signal terminal, and is used to adjust the preset voltage according to the adjustment signal of the adjustment signal terminal.

In an exemplary embodiment of the present disclosure, the adjustment signal terminal includes a plurality of sub-adjustment signal terminals; the voltage adjustment circuit includes: an operational amplifier and a first adjustment unit, the non-inverting input terminal of the operational amplifier is connected to the reference voltage terminal. The input terminal is connected to the fifth node, the fifth node is connected to the ground terminal, the output terminal is connected to the preset voltage terminal; the first adjustment unit is connected to the fifth node and the output terminal of the operational amplifier, and the first adjustment unit includes: at least one first resistor, at least one first switch, at least one first resistor connected in series between the fifth node and the output terminal of the operational amplifier. The first resistor is set corresponding to the sub-adjustment signal terminal, the first terminal and the second terminal of the first switch are respectively connected to the two terminals of the corresponding first resistor, and the control of the first switch unit terminal is connected to the corresponding sub-adjustment signal terminal.

In an exemplary embodiment of the present disclosure, the adjustment signal terminal includes a plurality of sub-adjustment signal terminals; the voltage adjustment circuit includes: an operational amplifier and a second adjustment unit, the non-inverting input terminal of the operational amplifier is connected to the reference voltage terminal. The input terminal is connected to a fifth node, the fifth node is connected to the output terminal of the operational amplifier, and the output terminal is connected to the preset voltage terminal; the second adjustment unit is connected between the fifth node and a ground terminal. The second adjustment unit includes: at least one second resistor, at least one second switch, at least one second resistor connected in series between the fifth node and the ground terminal; the second switch and the second resistor is set correspondingly, and is set corresponding to the sub-adjustment signal terminal, the first terminal and the second terminal of the second switch are respectively connected to the two terminals of the second resistor corresponding to it, and the control terminal of the second switch unit connects the corresponding sub-adjustment signal terminal.

In an exemplary embodiment of the present disclosure, the voltage regulation circuit further includes: a second regulation unit connected between the fifth node and a ground terminal, and the second regulation unit includes: At least one second resistor, at least one second switch, at least one second resistor is connected in series between the fifth node and the ground terminal; the second switch is set corresponding to the second resistor, and is connected to the sub-adjustment signal terminal is set correspondingly, the first terminal and the second terminal of the second switch are respectively connected to the two terminals of the corresponding second resistor, and the control terminal of the second switch unit is connected to the corresponding sub-adjustment signal terminal.

In an exemplary embodiment of the present disclosure, each of the first resistors has the same resistance value, or at least some of the first resistors have different resistance values; each of the second resistors has the same resistance value, or at least some of the resistance values of the second resistors are different.

In an exemplary embodiment of the present disclosure, at least one of the first resistors includes two of the first resistors, and at least one of the second resistors includes two of the second resistors.

In an exemplary embodiment of the present disclosure, the electronic device further includes: a signal generation circuit connected to the adjustment signal terminal, and configured to input the adjustment signal to the adjustment signal terminal according to a preset control signal.

In an exemplary embodiment of the present disclosure, the control circuit includes: a first transistor and a second transistor, the first terminal of the first transistor is connected to the third node, the second terminal is connected to the preset voltage terminal, and the gate terminal is connected to the first control signal terminal; the first terminal of the second transistor is connected to the fourth node, the second terminal is connected to the preset voltage terminal, and the gate is connected to the first control signal terminal; wherein, the first transistor and the second transistor both are N-type transistors or both are P-type transistors.

In an exemplary embodiment of the present disclosure, the sensitivity amplifier further includes: a first isolation circuit connected to the readout bit line, the complementary readout bit line, the third node, the fourth Node, the second control signal terminal, the first isolation circuit is used to connect the readout bit line and the fourth node in response to the signal of the second control signal terminal, and connect the complementary readout bit line and the Describe the third node.

In an exemplary embodiment of the present disclosure, the first isolation circuit includes: a third transistor and a fourth transistor, the first terminal of the third transistor is connected to the readout bit line, and the second terminal is connected to the fourth node, the gate is connected to the second control signal terminal; the first terminal of the fourth transistor is connected to the complementary readout bit line, the second terminal is connected to the third node, and the gate is connected to the second control signal terminal; wherein, the third transistor and the fourth transistor both are N-type transistors or both are P-type transistors.

In an exemplary embodiment of the present disclosure, the sensitivity amplifier further includes: an offset elimination circuit, a second isolation circuit, and a voltage equalization circuit, and the offset elimination circuit is connected to the bit line, the complementary bit line, and the readout bit line, a complementary readout bit line, a first control signal terminal, used to connect the bit line and the readout bit line in response to the signal of the first control signal terminal, and also used to respond to the signal of the first control signal terminal to connect the complementary bit line and the complementary readout bit line; the second isolation circuit connects the bit line, the complementary bit line, the readout bit line, the complementary readout bit line, and the third control signal terminal for responding to the signal of the third control signal terminal is used to connect the bit line and the complementary readout bit line, and is also used to connect the complementary bit line and the readout bit line in response to the signal of the third control signal terminal. The voltage equalizing circuit is connected to the readout bit line, the complementary readout bit line, and the fourth control signal terminal, and is used to connect the readout bit line and the complementary readout bit in response to the signal of the fourth control signal terminal Wire.

In an exemplary embodiment of the present disclosure, the offset canceling circuit includes: a fifth transistor and a sixth transistor, the first terminal of the fifth transistor is connected to the bit line, and the second terminal is connected to the readout bit line, the gate is connected to the first control signal terminal; the first terminal of the sixth transistor is connected to the complementary bit line, the second terminal is connected to the complementary readout bit line, and the gate is connected to the first control signal terminal; wherein, the fifth transistor and the sixth transistor are both N-type transistors or both are P-type transistors.

In an exemplary embodiment of the present disclosure, the second isolation circuit includes: a seventh transistor and an eighth transistor, the first terminal of the seventh transistor is connected to the bit line, and the second terminal is connected to the complementary readout bit line, the gate is connected to the third control signal terminal; the first terminal of the eighth transistor is connected to the complementary bit line, the second terminal is connected to the readout bit line, and the gate is connected to the third control signal terminal; wherein, the seventh transistor and the eighth transistor are both N-type transistors or both are P-type transistors.

In an exemplary embodiment of the present disclosure, the voltage equalization circuit includes: a ninth transistor, the first terminal of the ninth transistor is connected to the readout bit line, the second terminal is connected to the complementary readout bitline, and the gate Connect the fourth control signal terminal.

In an exemplary embodiment of the present disclosure, the electronic device further includes: a programmable fuse circuit, the programmable fuse circuit is connected to the signal generation circuit, and is used to input the preset control signal to the signal generation circuit.

In an exemplary embodiment of the present disclosure, the electronic device further includes: a test signal terminal connected to the signal generation circuit for inputting different test control signals to the signal generation circuit during a testing phase.

In an exemplary embodiment of the present disclosure, the electronic device is a memory.

According to one embodiment of the present disclosure, an electronic device driving method is provided, the driving method is used to drive the above-mentioned electronic device, and the driving method includes:

In the testing phase, using the test signal terminal to input different control signals to the signal generation circuit, so as to obtain the optimal voltage of the preset voltage terminal.

In the driving phase, the programmable fuse circuit inputs the control signal corresponding to the optimal voltage to the signal generating circuit.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

DETAILED DESCRIPTION OF THE PREFERRED EMBODIMENTS

Figure 1:
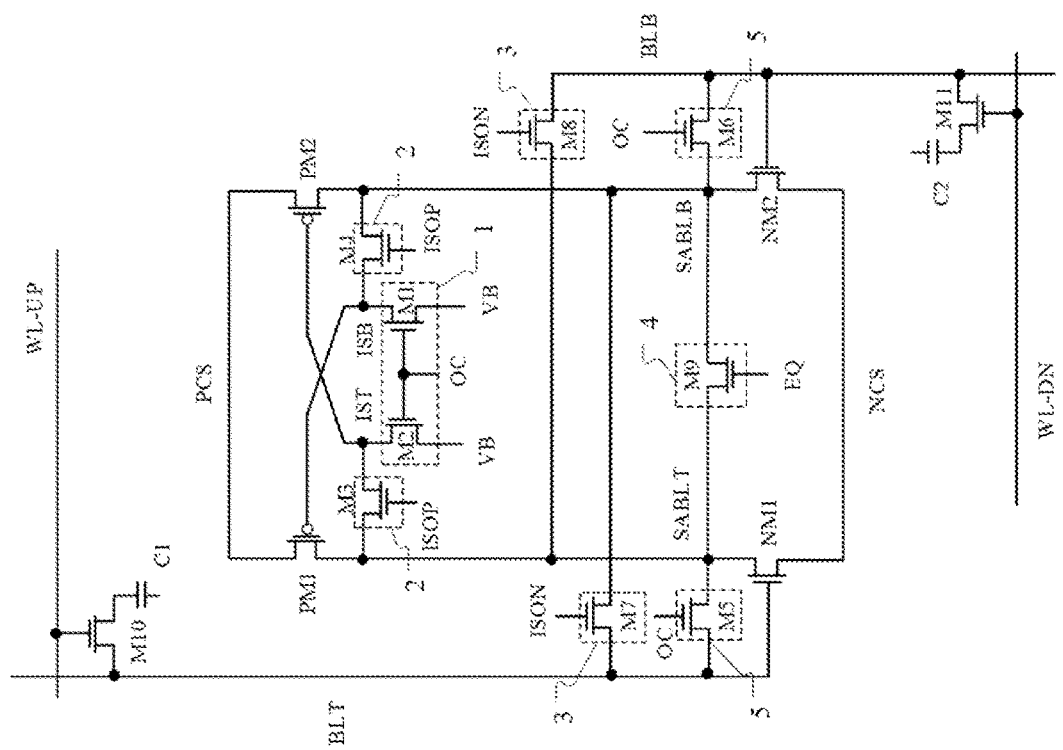
FIG. 1 is a schematic circuit diagram of a sensitivity amplifier according to an embodiment of the present disclosure.

Example embodiments will now be described more fully with reference to the accompanying drawings. Example embodiments may, however, be embodied in many forms and should not be construed as limited to the examples set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted.

The terms "a", "an" and "the" are used to indicate the presence of one or more elements/components/etc; Additional elements/components/etc. may be present in addition to the listed elements/components/etc.

This exemplary embodiment first provides a sensitivity amplifier, as shown in FIG. 1, which is a schematic circuit diagram of a sensitivity amplifier according to an embodiment of the present disclosure. The sensitivity amplifier may include: a first P-type transistor PM1, a second P-type transistor PM2, a first N-type transistor NM1, a second N-type transistor NM2, and a control circuit 1. The first terminal of the first P-type transistor PM1 is connected to the second A node PCS, the second terminal is connected to the readout bit line SABLT, and the gate is connected to the third node ISB; the first terminal of the second P-type transistor PM2 is connected to the first node PCS, and the second terminal is connected to the complementary readout bitline SABLB, the gate is connected to the fourth node IST; the first terminal of the first N-type transistor NM1 is connected to the second node NCS, the second terminal is connected to the readout bit line SABLT, and the gate is connected to the bit line BLT. The first terminal of the second N-type transistor NM2 is connected to the second node NCS, the second terminal is connected to the complementary readout bit line SABLB, and the gate is connected to the complementary bit line BLB; the control circuit 1 is connected to the third node ISB, and the fourth node IST, the preset voltage terminal VB, and the first control signal terminal OC, provided for connecting the preset voltage terminal VB with the third node ISB and the fourth node IST in response to the signal of the first control signal terminal OC.

The sensitivity amplifier can use the control circuit 1 to connect the preset voltage terminal VB to the third node ISB and the fourth node IST in the phase of offset elimination. Therefore, the conduction degree of the first P-type transistor PM1 and the second P-type transistor PM2 can be adjusted by controlling the voltage of the preset voltage terminal VB, and the offset of the first P-type transistor PM1 and the second P-type transistor PM2 can be eliminated, and at the same time the voltages of the bit line BLT and the complementary bit line BLB are adjusted stably so that the voltage difference between the bit line BLT and the complementary bit line BLB is within a proper voltage range.

In this exemplary embodiment, as shown in FIG. 1, the control circuit 1 may include: a first transistor M1 and a second transistor M2, the first terminal of the first transistor M1 is connected to the third node ISB, and the second terminal connected to the preset voltage terminal VB, the gate is connected to the first control signal terminal OC; the first terminal of the second transistor M2 is connected to the fourth node IST, the second terminal is connected to the preset voltage terminal VB, and the gate terminal is connected to the first control signal terminal OC; wherein, the first transistor M1 and the second transistor M2 can both be N-type transistors. It should be understood that in other exemplary embodiments, the first transistor M1 and the second transistor M2 may both be P-type transistors.

In this exemplary embodiment, as shown in FIG. 1. The sensitivity amplifier may further include: a first isolation circuit 2, the first isolation circuit 2 is connected to the readout bit line SABLT, the complementary readout bit line SABLB, the third node ISB, the fourth node IST, the second control signal terminals ISOP, the first isolation circuit 2 is used to connect the readout bit line SABLT and the fourth node IST in response to the signal of the second control signal terminal ISOP, and connect the complementary readout bit line SABLB and the third node ISB.

In this exemplary embodiment, as shown in FIG. 1, the first isolation circuit 2 may include: a third transistor M3 and a fourth transistor M4, the first terminal of the third transistor M3 is connected to the readout bit line SABLT. The second terminal is connected to the fourth node IST, the gate is connected to the second control signal terminal ISOP; the first terminal of the fourth transistor M4 is connected to the complementary readout bit line SABLB, and the second terminal is connected to the third node ISB, the gate is connected to the second control signal terminal ISOP; wherein, the third transistor M3 and the fourth transistor M4 can both be N-type transistors. It should be understood that, in other exemplary embodiments, the third transistor M3 and the fourth transistor M4 may both be P-type transistors as well.

In this exemplary embodiment, as shown in FIG. 1, the sensitivity amplifier may further include: an offset elimination circuit 5, a second isolation circuit 3, and a voltage equalization circuit 4, and the offset elimination circuit 5 is connected to the bit line BLT, the complementary bit line BLB, the readout bit line SABLT, the complementary readout bit line SABLB, and the first control signal terminal OC are used to connect the bit line BLT and the readout signal in response to the signal of the first control signal terminal OC. The bit line SABLT is also used to connect the complementary bit line BLB and the complementary readout bit line SABLB in response to the signal of the first control signal terminal OC; the second isolation circuit 3 is connected to the bit line BLT, complementary bit line BLB, the readout bit line SABLT, the complementary readout bit line SABLB, and the third control signal terminal ISON are used to connect the bit line BLT and the complementary read signal terminal ISON in response to the signal of the third control signal terminal ISON, the bit line SABLB, and is also used to connect the complementary bit line BLB and the readout bit line SABLT in response to the signal of the third control signal terminal ISON; the equalizing circuit 4 is connected to the readout bit line SABLT, complementary readout bit line SABLB and the fourth control signal terminal EQ are used for connecting the readout bitline SABLT and the complementary readout bitline SABLB in response to the signal of the fourth control signal terminal EQ.

In this exemplary embodiment, as shown in FIG. 1, the offset elimination circuit 5 includes: a fifth transistor M5 and a sixth transistor M6, the first terminal of the fifth transistor M5 is connected to the bit line BLT, and the second terminal connected to the readout bit line SABLT, the gate is connected to the first control signal terminal OC; the first terminal of the sixth transistor M6 is connected to the complementary bitline BLB, and the second terminal is connected to the complementary readout bitline SABLB, the gate is connected to the first control signal terminal OC; wherein, the fifth transistor M5 and the sixth transistor M6 can both be N-type transistors. It should be understood that in other exemplary embodiments, the fifth transistor M5 and the sixth transistor M6 may both be P-type transistors as well.

In this exemplary embodiment, as shown in FIG. 1, the second isolation circuit 3 may include: a seventh transistor M7 and an eighth transistor M8, the first terminal of the seventh transistor M7 is connected to the bit line BLT, and the second terminal is connected to the complementary readout bit line SABLB, the gate is connected to the third control signal terminal ISON; the first terminal of the eighth transistor M8 is connected to the complementary bit line BLB, and the second terminal is connected to the readout bit line SABLT, the gate of which is connected to the third control signal terminal ISON; wherein, the seventh transistor M7 and the eighth transistor M8 may both be N-type transistors. It should be understood that, in other exemplary embodiments, the seventh transistor M7 and the eighth transistor M8 may both be P-type transistors.

In this exemplary embodiment, as shown in FIG. 1, the voltage equalizing circuit 4 may include: a ninth transistor M9, the first terminal of the ninth transistor M9 is connected to the readout bit line SABLT, and the second terminal is connected to the gate of the complementary readout bit line SABLB is connected to the fourth control signal terminal EQ. Wherein, the ninth transistor M7 may be an N-type transistor.

As shown in FIG. 1, the bit line BLT can be connected to an electrode of the first capacitor C1 through the tenth transistor M10, and the gate of the tenth transistor M10 can be connected to the first word line WL-UP. The complementary bit line BLB can be connected to the first electrode of the second capacitor C2 through the eleventh transistor M11, and the gate of the eleventh transistor M11 can be connected to the second word line WL-DN.

Figure 2:
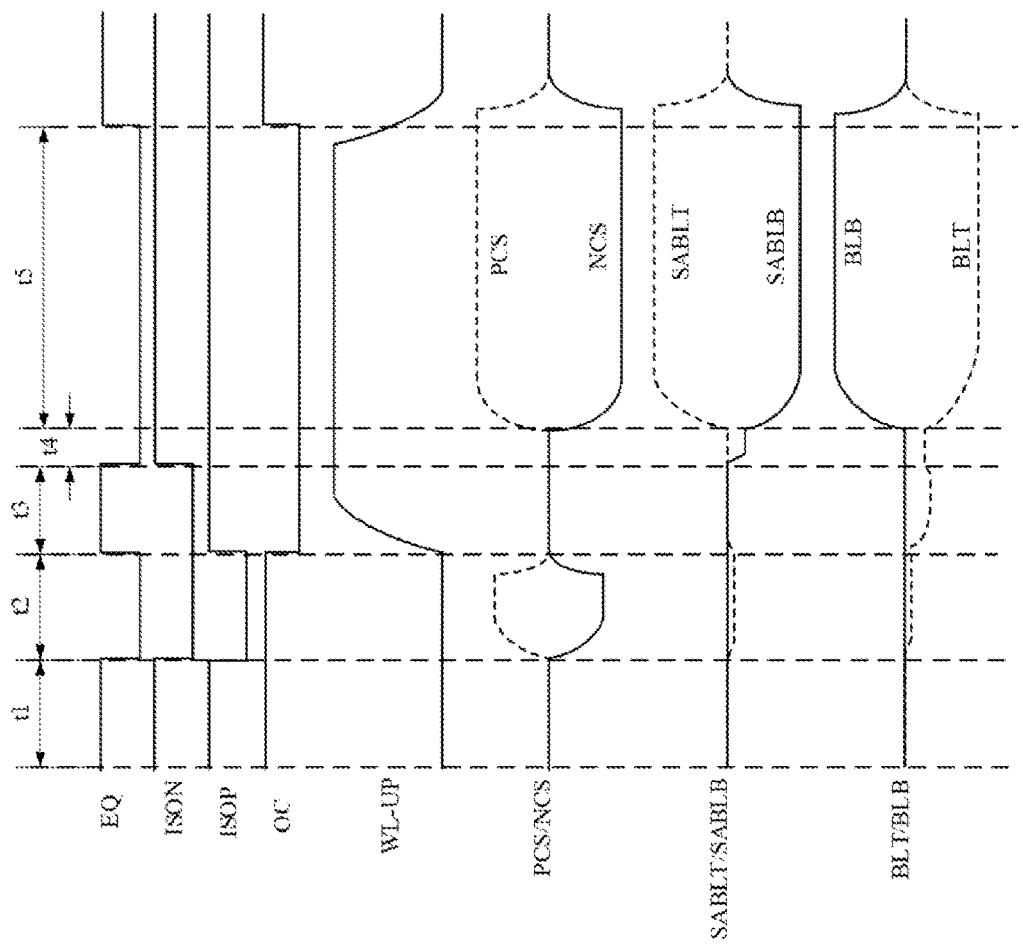
FIG. 2 is the timing diagram at each node in driving the sensitivity amplifier shown in FIG. 1.

As shown in FIG. 2, it is the timing diagram at each node in driving the sensitivity amplifier shown in FIG. 1. Among them, EQ is the timing diagram of the fourth control signal terminal, ISON is the timing diagram of the third control signal terminal, ISOP is the timing diagram of the second control signal terminal, OC is the timing diagram of the first control signal terminal, WL-UP is the first word line PCS (dashed line) is the timing diagram of the first node, NCS is the timing diagram of the second node, SABLT (dashed line) is the timing diagram of the readout bit line, SABLB (solid line) is the complementary readout bit line timing diagram, BLT (dotted line) is the timing diagram of the bit line, BLB (solid line) is the timing diagram of the complementary bit line.

As shown in FIG. 2, the driving method of the sensitivity amplifier may include five stages: a pre-charge stage t1, an offset elimination stage t2, a charge sharing stage t3, a pre-sensing stage t4, and an amplification stage t5.

Figure 3:
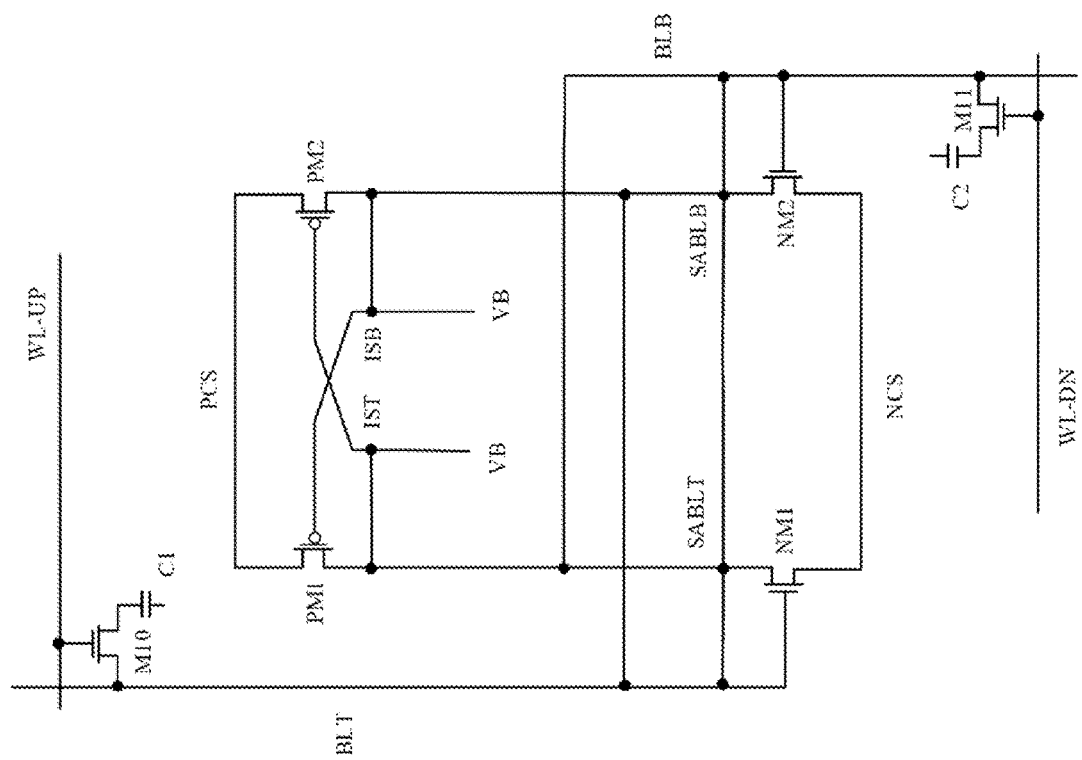
FIG. 3 is the equivalent state diagram at the pre-charge stage of the sensitivity amplifier shown in FIG. 1.

In the pre-charging phase t1, a high-level signal is provided to the fourth control signal terminal EQ, the third control signal terminal ISON, the second control signal terminal ISOP, and the first control signal terminal OC. As shown in FIG. 3, it is the equivalent state diagram at the pre-charge stage of the sensitivity amplifier shown in FIG. 1, wherein the first transistor M1, the second transistor M2, the third transistor M3, the fourth transistor M4, the fifth transistor M5, the sixth transistor M6, the seventh transistor M7, the eighth transistor M8, and the ninth transistor M9 are all turned on, and the preset voltage terminal VB writes the preset voltage signal to the bit line BLT, the complementary bit line BLB, the readout bit line SABLT, and the complementary readout bit line SABLB. The first node PCS and the second node NCS can maintain preset voltage signals through an external voltage.

In the offset elimination phase t2, a low-level signal can be provided to the fourth control signal terminal EQ, the third control signal terminal ISON, and the second control signal terminal ISOP, and a high-level signal can be provided to the first control signal terminal OC. At the same time, the first power supply signal is provided to the first node PCS through an external power supply, and the second power supply signal is provided to the second node NCS. The first power signal has a first voltage, and the second power signal may be a signal of a ground terminal.

Figure 4:
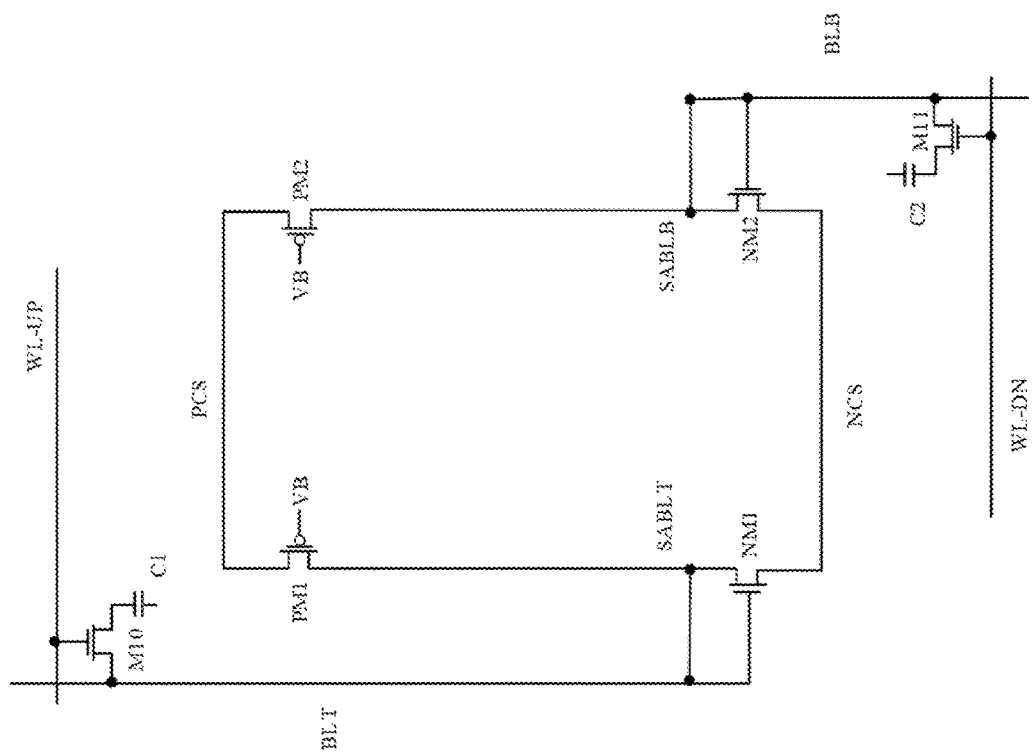
FIG. 4 is the equivalent state diagram in the phase of offset elimination of the sensitivity amplifier shown in FIG. 1.

As shown in FIG. 4, it is the equivalent state diagram in the phase of offset elimination of the sensitivity amplifier shown in FIG. 1. The third transistor M3, the fourth transistor M4, the seventh transistor M7, the eighth transistor M8, and the ninth transistor M9 are turned off, and the first transistor M1, the second transistor M2, the fifth transistor M5, and the sixth transistor M6 are turned on. The first P-type transistor PM1 and the second P-type transistor PM2 are turned on by the preset voltage signal of the preset voltage terminal VB, and the first node PCS is respectively connected to the sense bit line SABLT and the complementary sense bit line SABLB. At the same time, the first N-type transistor NM1 is turned on under the signal of the bit line BLT, the second N-type transistor NM2 is turned on under the signal of the complementary bit line BLB, and the second node NCS is connected to the readout bit line SABLT and the complementary readout bit line respectively. bit line SABLB. Finally, due to the difference in threshold value between the first P-type transistor PM1, the second P-type transistor PM2, the first N-type transistor NM1 and the second N-type transistor NM2, there is a voltage difference between the bit line BLT and the complementary bit line BLB, so that the following charge sharing stage t3, pre-sensing stage t4, amplification stage t5, then control the first N-type transistor NM1 and the second N-type transistor NM2, or the first P-type transistor through the bit line BLT and the complementary bit line BLB with a certain voltage difference between PM1 and the second P-type transistor PM2, so as to realize the offset elimination of the first N-type transistor NM1 and the second N-type transistor NM2, and the first P-type transistor PM1 and the second P-type transistor PM2.

The sensitivity amplifier of this embodiment can not only realize the offset elimination of the N-type transistor, but also realize the offset elimination of the P-type transistor. Wherein, the conduction degree of the first P-type transistor PM1 and the second P-type transistor PM2 can be stably controlled by controlling the preset voltage signal of the preset voltage terminal VB, so as to avoid the first P-type transistor PM1 and the second P-type transistor PM2. The conduction is affected by the voltage difference between the bit line BLT and the complementary bit line BLB, and at the same time, the potential difference between the bit line BLT and the complementary bit line BLB is kept stable in the phase of offset elimination, so that the voltage difference between the bit line BLT and the complementary bit line BLB is at an appropriate Within the appropriate voltage range, the potential difference between the bit line BLT and the complementary bit line BLB can achieve a better offset cancellation effect, and at the same time, the bit line BLT and the complementary bit line BLB can be easily measured and amplified by the sensitivity amplifier.

Figure 5:
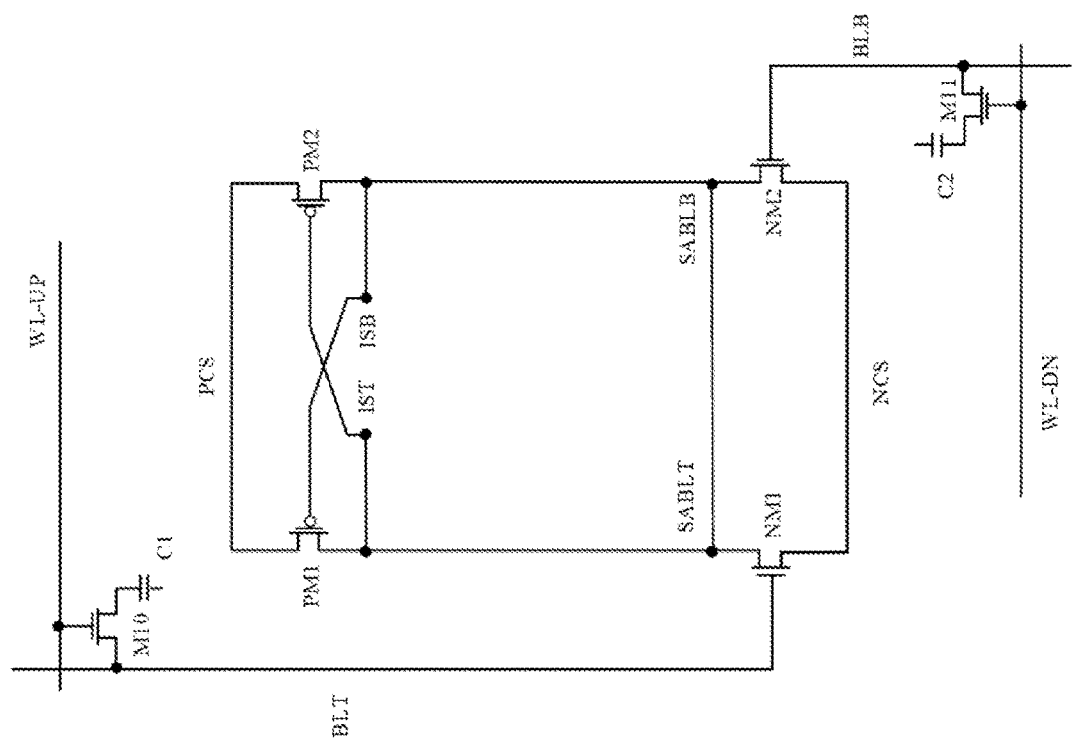
FIG. 5 is the equivalent state diagram at the charge sharing stage of the sensitivity amplifier shown in FIG. 1.

In the charge sharing phase t3, a low-level signal can be provided to the first control signal terminal OC and the third control signal terminal ISON, and a low-level signal can be provided to the fourth control signal terminal EQ, the second control signal terminal ISOP, and the first word line WL-UP. high level signal. As shown in FIG. 5, it is the equivalent state diagram at the charge sharing stage of the sensitivity amplifier shown in FIG. 1. The third transistor M3, the fourth transistor M4, and the ninth transistor M9 are all turned on, and the first transistor M1, the second transistor M2, the fifth transistor M5, the sixth transistor M6, the seventh transistor M7, and the eighth transistor M8 are all turned off. Based on the fourth control signal terminal EQ, the potentials of the readout bit line SABLT and the complementary readout bit line SABLB are the same, and based on the tact that voltages of the first node PCS and the second node NCS set as preset voltage signals, voltages of the readout bit line SABLT and the complementary readout bit line SABLT can be restored to the voltage of the preset voltage signal.

At the same time, based on the high-level signal of the first word line WL-UP, the data stored in the first capacitor C1 will be transmitted to the bit line BLT. For example, when the data stored in the first capacitor C1 is logic 0, the voltage of the bit line BLT will decline.

Figure 6:
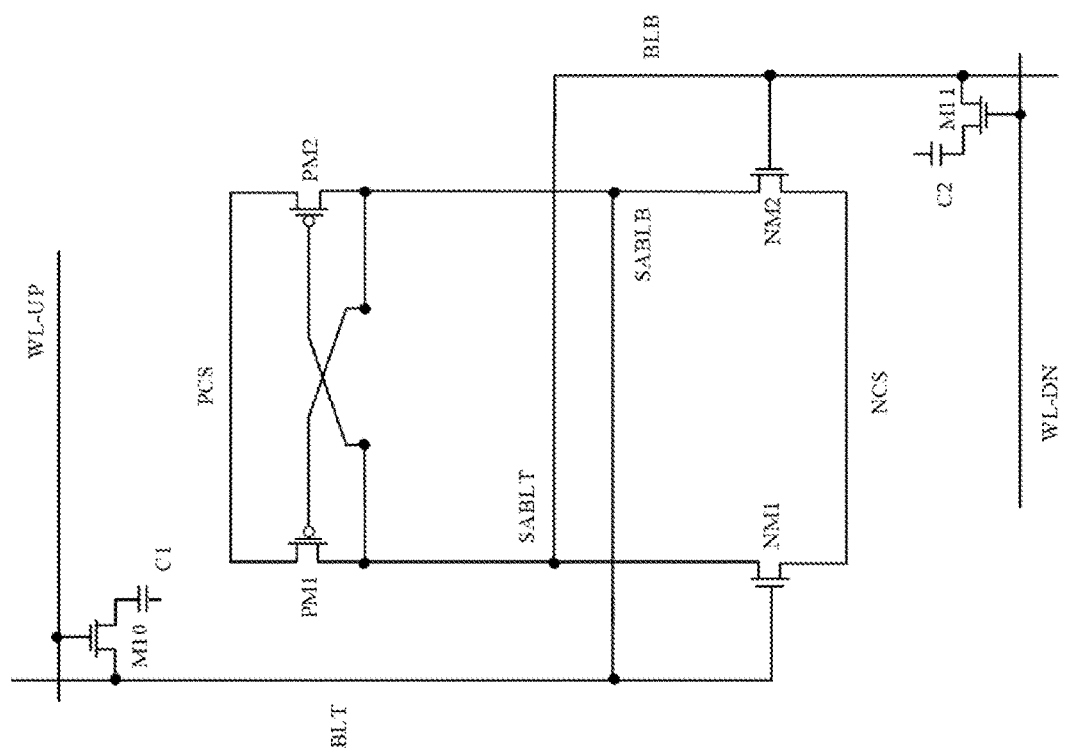
FIG. 6 is the equivalent state diagram in the pre-sensing stage of the sensitivity amplifier shown in FIG. 1.

In the pre-sensing phase t4, a low-level signal can be provided to the first control signal terminal OC and the fourth control signal terminal EQ, and a low-level signal can be provided to the third control signal terminal ISON, the second control signal terminal ISOP, and the first word line WL-UP. high level signal. As shown in FIG. 6, it is the equivalent state diagram in the pre-sensing stage of the sensitivity amplifier shown in FIG. 1. The third transistor M3, the fourth transistor M4, the seventh transistor M7, and the eighth transistor M8 are all turned on, and the first transistor M1, the second transistor M2, the fifth transistor M5, the sixth transistor M6, and the ninth transistor M9 are all turned off. The complementary readout bit line SABLB is connected to the bit line BLT, the readout bit line SABLT is connected to the complementary bit line BLB, and the voltage of the complementary readout bit line SABLB drops slightly under the action of the bit line BLT.

Figure 7:
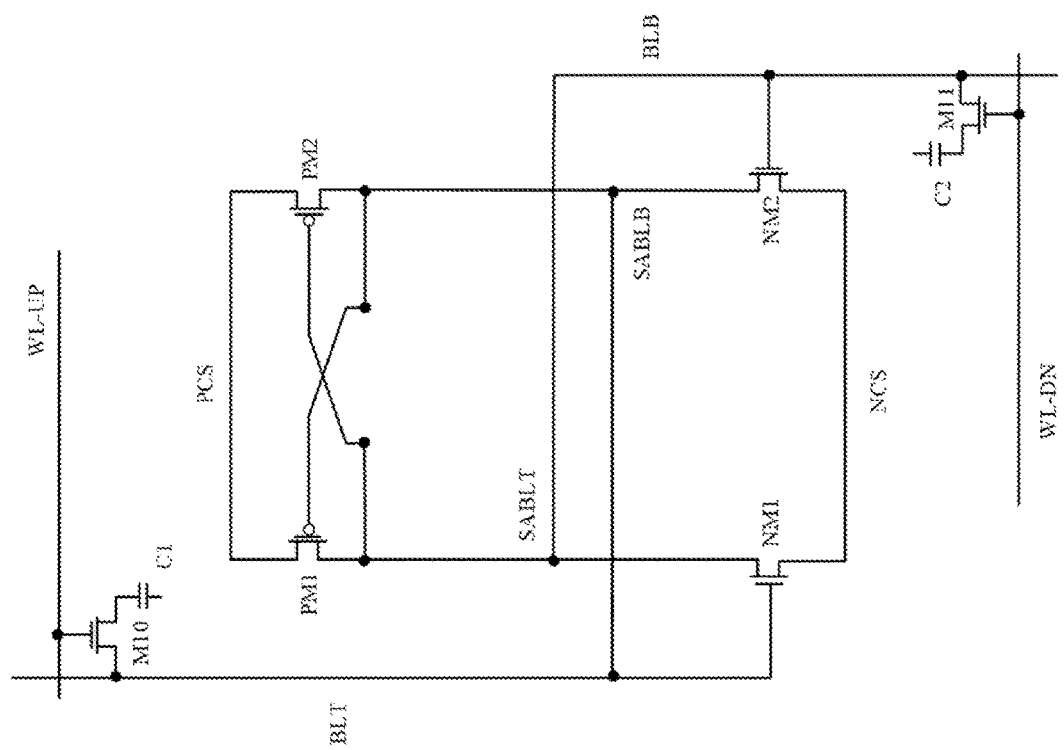
FIG. 7 is the equivalent state diagram in the amplification stage of the sensitivity amplifier shown in FIG. 1.

In the amplification stage t5, a low-level signal can be provided to the first control signal terminal OC and the fourth control signal terminal EQ, and a high-level signal can be provided to the third control signal terminal ISON, the second control signal terminal ISOP, and the first word line WL-UP. level signal. As shown in FIG. 7, it is the equivalent state diagram in the amplification stage of the sensitivity amplifier shown in FIG. 1. At the same time, a first power signal is provided to the first node PCS, and a second power signal is provided to the second node NCS. The third transistor M3, the fourth transistor M4, the seventh transistor M7, and the eighth transistor M8 are all turned on, and the first transistor M1, the second transistor M2, the fifth transistor M5, the sixth transistor M6, and the ninth transistor M9 are all turned off. The first P-type transistor PM1 is turned on under the low-level voltage of the complementary readout bit line SABLB, and the readout bit line SABLT is pulled up to a high potential by the first node PCS; the second N-type transistor NM2 becomes conducted under the voltage of the complementary readout bit line SABLB, the potential of the complementary readout bit line SABLB is further pulled down by the second node NCS, thereby realizing the voltage amplification of the readout bit line SABLT and the complementary readout bit line SABLB, and the amplified signals can be separately read to the bit line BLT and the complementary bit line BLB, and the potential of the first capacitor C1 can be restore through the bit line BLT.

Figure 8:
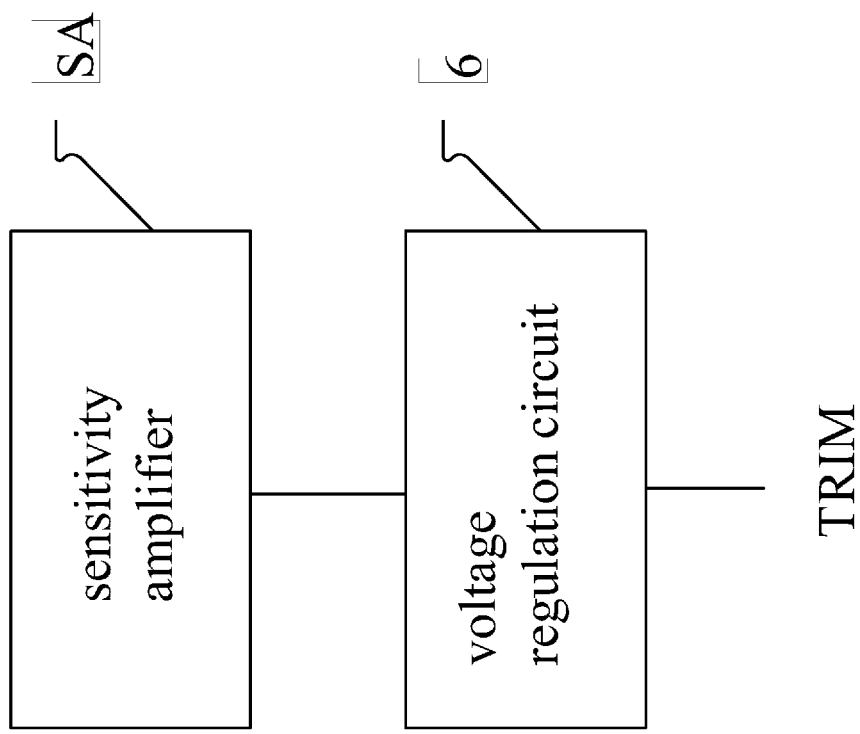
FIG. 8 is a schematic block diagram of an electronic device according to an embodiment of the present disclosure.

This exemplary embodiment also provides an electronic device, as shown in FIG. 8, which is a schematic block diagram of an electronic device according to an embodiment of the present disclosure. The electronic device may include: the above-mentioned sensitivity amplifier SA and the voltage regulation circuit 6. The voltage regulation circuit 6 can be connected to the preset voltage terminal VB of the sensitivity amplifier SA and the adjustment signal terminal TRIM, and is used to input a preset voltage signal to the preset voltage terminal VB according to the adjustment signal of the adjustment signal terminal TRIM.

Figure 9:
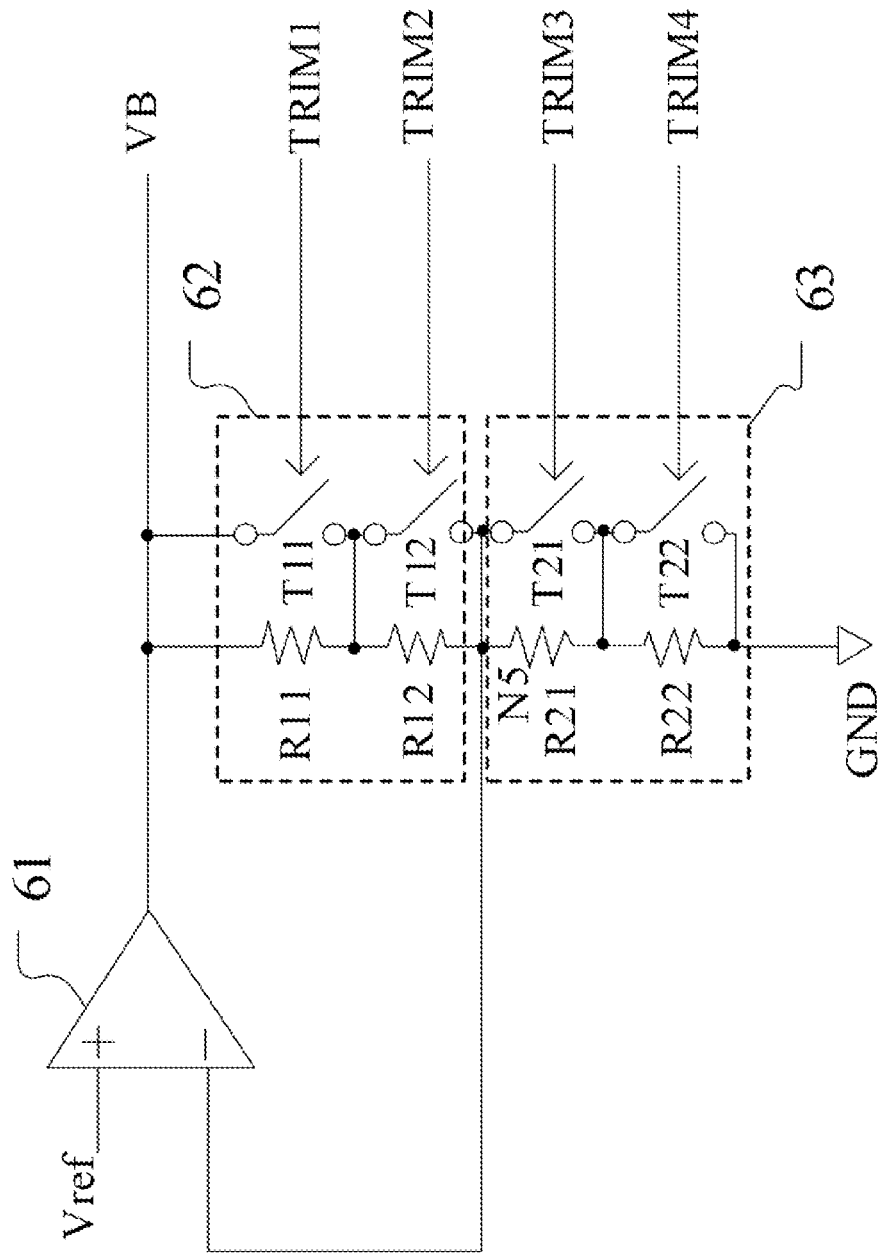
FIG. 9 is a schematic block diagram of a voltage regulation circuit according to an exemplary embodiment of the present disclosure.

In this exemplary embodiment, as shown in FIG. 9, it is a schematic block diagram of a voltage regulation circuit according to an exemplary embodiment of the present disclosure. As shown in FIG. 9, the adjustment signal terminal TRIM includes a plurality of sub-adjustment signal terminals TRIM1, TRIM2, TRIM3, and TRIM4. The voltage regulating circuit 6 may include: an operational amplifier 61 and a first adjustment unit 62, the non-inverting input terminal of the operational amplifier 61 is connected to the reference voltage terminal Vref, the inverting input terminal is connected to the fifth node N5, and the fifth node N5 is connected to ground terminal GND, the output terminal is connected to the preset voltage terminal VB; the first adjustment unit 62 is connected between the fifth node N5 and the output terminal of the operational amplifier, and the first adjustment unit 62 may include: multiple first resistors R11, R12, multiple first switches T11, T12, multiple first resistors R11, R12 connected in series between the fifth node N5 and the output terminal of the operational amplifier; the first A switch is set corresponding to the first resistor and set corresponding to the sub-adjustment signal terminal, for example, the first switch T11 is set corresponding to the first resistor R11 and the sub-adjustment signal terminal TRIM1, and the sub-adjustment signal terminal TRIM1 controls the first switch T11, where the first switch T11 is turned on, the first switch T12 is set corresponding to the first resistor R12 and the sub-adjustment signal terminal TRIM2, and the sub-adjustment signal terminals TRIM2 controls the conduction of the first switch T12, the first terminal and the second terminal of the first switch are respectively connected to the two terminals of the corresponding first resistors, and the control terminal of the first switch unit is connected to the corresponding sub-adjustment signal terminal.

In this exemplary embodiment, as shown in FIG. 9, the voltage regulation circuit may further include: a second adjustment unit 63, the second adjustment unit 63 is connected between the fifth node N5 and the ground terminal GND, the second adjustment unit 63 may include: a plurality of second resistors R21, R22, a plurality of second switches T21, T22, and the plurality of second resistors R21, R22 are connected in series with the fifth node N5 and the ground terminal GND; the second switch is set corresponding to the second resistor, and is set corresponding to the sub-adjustment signal terminal, for example, the second switch T21 is set corresponding to the second resistor R21, and the sub-adjustment signal terminal TRIM3, and the sub-adjustment signal terminal TRIM3 controls the conduction of the second switch T21; the second switch T22 is set corresponding to the second resistor R22 and the sub-adjustment signal terminal TRIM4, and the sub adjustment signal terminal TRIM4 controls the conduction of the second switch T22. The first terminal and the second terminal of the second switch are respectively connected to two terminals of the corresponding second resistor, and the control terminal of the second switch unit is connected to the corresponding sub-adjustment signal terminal.

In this exemplary embodiment, the voltage at the output terminal of the operational amplifier is: V=Vref (1+R1/R2). Herein, Vref is the voltage at the reference voltage terminal, R1 is the total resistance value of the first resistor connected in series between the fifth node and the output terminal of the operational amplifier, and R2 is the total resistance value of the second resistor connected in series between the fifth node and the ground terminal GND. resistance. In this example, the on-off of the first switch T11, T12 and the second switch T21, T22 are controlled through the sub-adjustment signal terminal, thereby the total resistance value of the first resistor connected in series between the fifth node and the output terminal of the operational amplifier R1 are controlled, and the total resistance value R2 of the second resistor connected in series between the fifth node and the ground terminal are controlled, thereby the voltage at the output terminal of the operational amplifier is controlled. For example, when the first switches T11, T12 and the second switches T21, T22 are both turned off, the voltage at the output terminal of the operational amplifier is V=Vref×[1+(R11+R12)/(R21+R22)]; another example, when the first switch T11 is turned on, the first switch T12 is turned off, and both the second switches T21 and T22 are turned off, the voltage at the output terminal of the operational amplifier is: V=Vref×[1+R12/(R21+R22)]. Herein, R11 is the resistance value of the first resistor R11, R12 is the resistance value of the first resistor R12, R21 is the resistance value of the second resistor R21, and R22 is the resistance value of the second resistor R22.

In this exemplary embodiment, the first adjustment unit 62 may include two first resistors and two first switches, and the second adjustment unit 63 may include two second resistors and two second switches. It should be understood that, in other examples, the number of the first resistor and the second resistor may be other numbers, for example, the number of the first resistor and the second resistor may be one or more. In addition, in other exemplary embodiments, the first adjustment unit 62 may not include the first switch unit, that is, in the first adjustment unit 62, the total of the first resistor connected in series between the fifth node N5 and the output terminal of the operational amplifier. The resistance value is a fixed value, and this setting can adjust the voltage at the output terminal of the operational amplifier only by adjusting the total resistance value of the second resistor connected in series between the fifth node N5 and the ground terminal GND. Similarly, the second adjustment unit 63 may not include a second switch unit, that is, in the second adjustment unit 63, the total resistance value of the second resistor connected in series between the fifth node N5 and the ground terminal GND is a constant value, and the setting the voltage at the output terminal of the operational amplifier can be adjusted only by adjusting the total resistance value of the first resistor connected in series between the fifth node and the output terminal of the operational amplifier.

In this exemplary embodiment, each of the first resistors has the same resistance value, or at least some of the first resistors have different resistance values; each of the second resistors has the same resistance value, or at least some of the first resistors have the same resistance value. The resistance values of the two resistors are different.

Figure 10:
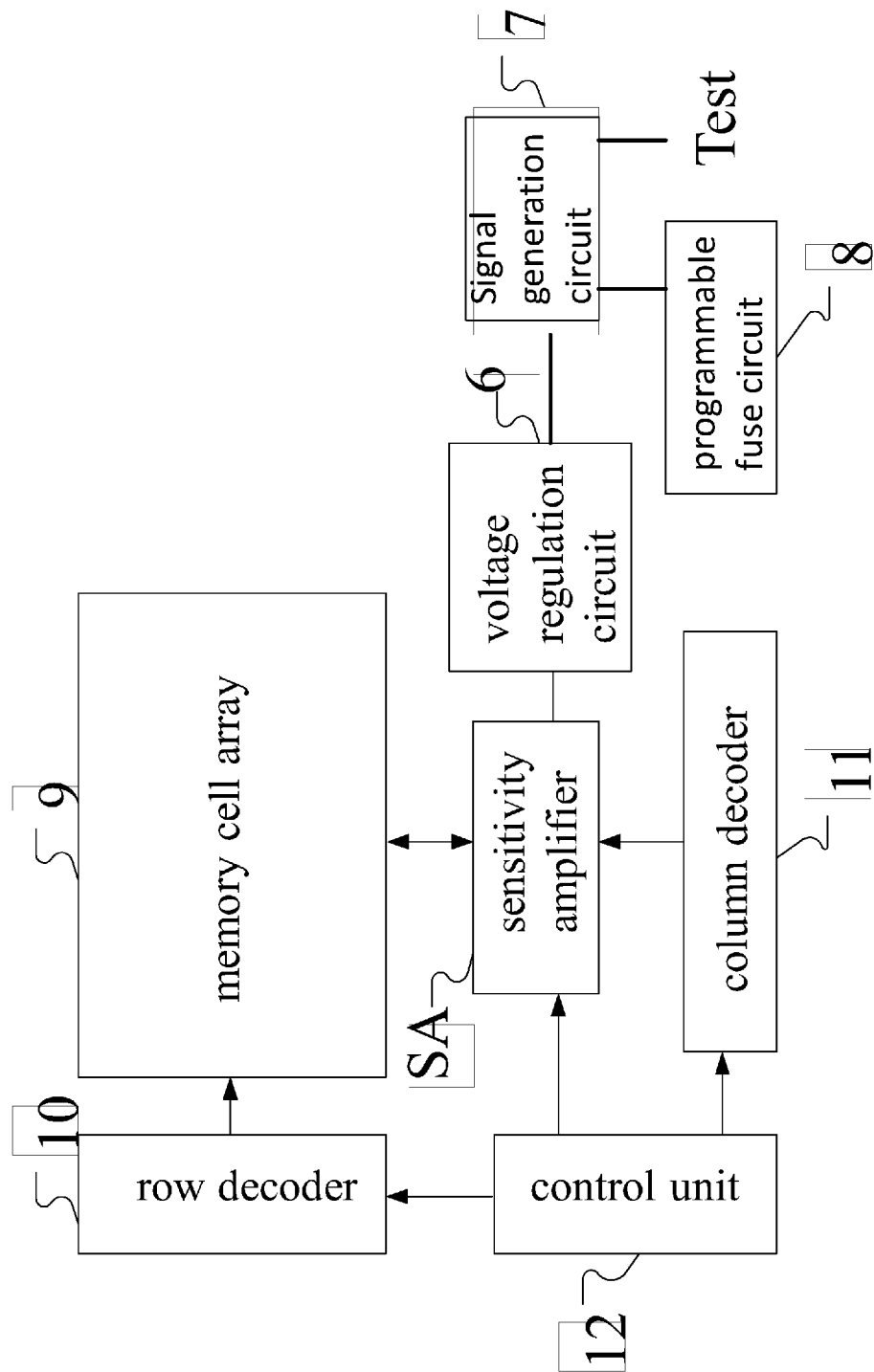
FIG. 10 is a schematic block diagram of an electronic device according to another exemplary embodiment of the present disclosure.

In this exemplary embodiment, as shown in FIG. 10, it is a schematic block diagram of an electronic device according to another exemplary embodiment of the present disclosure. The electronic device may further include: a signal generation circuit 7 connected to the adjustment signal terminal TRIM and configured to input the adjustment signal to the adjustment signal terminal TRIM according to a preset control signal.

In this exemplary embodiment, as shown in FIG. 10, the electronic device further includes: a test signal terminal Test, the test signal terminal Test is connected to the signal generating circuit 7, and the test signal terminal test can be used to send the test signal to the signal generation circuit inputting different test control signals to obtain the optimal voltage of the preset voltage terminal VB, which can make the voltage difference between the bit line BLT and the complementary bit line BLB of the sensitivity amplifier SA in a stable value during the offset elimination phase In order to improve the offset cancellation effect of each device in the sensitivity amplifier SA, the bit line BLT and the complementary bit line BLB can be easily amplified by the sensitivity amplifier.

In this exemplary embodiment, as shown in FIG. 10, the electronic device may further include: a programmable fuse circuit 8, which may be connected to the signal generating circuit 7, and the programmable fuse circuit 8 may be It is used for inputting the control signal corresponding to the optimal voltage to the signal generation circuit 7 in the driving phase.

The programmable fuse circuit 8 includes a plurality of programmable fuses, and each programmable fuse outputs different signals according to whether it is blown or not. For example, when the programmable fuse is in a non-fuse state, it cannot conduct the input voltage to output a logic signal "0"; the programmable fuse can conduct the input voltage and output a logic signal "1" in the blown state. Thus, a plurality of control signals can be output through a plurality of programmable fuses. In this exemplary embodiment, the number of programmable fuses is the same as the number of first switches and second switches. In the test phase, by continuously inputting different test signals, the signal generating circuit outputs different control signals, controls the number of closures of the first switch and the second switch in the voltage regulating circuit, and continuously adjusts the output voltage of the voltage regulating circuit 6. Under the optimal test signal, the optimal voltage required by the sensitivity amplifier SA is obtained, that is, the voltage of the preset voltage signal. Then control part of the programmable fuse to blow to form an optimal test signal, the optimal test signal is a fixed signal, and when the memory is working, the signal generation circuit 7 acquires the states of each device in the programmable fuse circuit 8 to generate an optimal control signal, the voltage regulation circuit 6 generates a preset voltage according to the optimal control signal.

In this exemplary embodiment, as shown in FIG. 10, the electronic device is a memory. The electronic device may also include a memory cell array 9, a row decoder 10, a column decoder 11, and a control unit 12. The memory cell array 9 includes a plurality of memory cells distributed in rows and columns. Wherein, the control unit 12 can be used to send the address of the storage unit, and the address can include a row address and a column address, and the control unit 12 can control the sensitivity amplifier SA to enter the pre-charging phase t1 and the offset elimination phase t2 in FIG. 2. The control unit 12 can also open the corresponding row of memory cells through the row decoder 10, so that the sensitivity amplifier SA of a row can start to enter the charge sharing stage t3, the pre-sensing stage t4, and the amplification stage t5, and the sensitivity amplifier SA senses the data of the memory cells. Finally, the control unit 12 can turn on the desired sensitivity amplifier SA through the column decoder 11, so as to transmit the data sensed by the sensitivity amplifier SA. 6.

This exemplary embodiment also provides an electronic device driving method, the driving method is used to drive the above-mentioned electronic device, and the driving method includes:

In the testing phase, using the test signal terminal to input different control signals to the signal generation circuit to obtain the optimal voltage of the preset voltage terminal VB.

In the driving phase, the programmable fuse circuit is used to input the control signal corresponding to the optimal voltage to the signal generating circuit.

The driving stage is the official working stage of the memory including the sensitivity amplifier SA. Before the memory starts to work, a lot of testing work is required to ensure that the parameters of the memory are stable.

Other embodiments of the disclosure will be readily apparent to those skilled in the art from consideration of the specification and practice of the disclosure herein. The present disclosure is intended to cover any modification, use or adaptation of the present disclosure. These modifications, uses or adaptations follow the general principles of the present disclosure and include common knowledge or conventional technical means in the technical field not disclosed in the present disclosure. The specification and examples are to be considered exemplary only, with the true scope and spirit of the disclosure indicated by the appended claims.

It should be understood that the present disclosure is not limited to the precise constructions which have been described above and shown in the drawings, and various modifications and changes may be made without departing from the scope thereof. The scope of the present disclosure is limited only by the appended claims.

The invention claimed is:

1. An electronic device, comprising:
a sensitivity amplifier, wherein the sensitivity amplifier comprises:
a first P-type transistor, wherein a first terminal of the first P-type transistor is connected to a first node, a second terminal is connected to a readout bit line, and a gate of the first P-type transistor is connected to a third node;
a second P-type transistor, wherein a first terminal of the second P-type transistor is connected to the first node, a second terminal of the second P-type transistor is connected to a complementary readout bit line, and a gate of the second P-type transistor is connected to a fourth node;
a first N-type transistor, wherein a first terminal of the first N-type transistor is connected to a second node, a second terminal of the first N-type transistor is connected to the readout bit line, and a gate is connected to a bit line;
a second N-type transistor, wherein a first terminal of the second N-type transistor is connected to the second node, a second terminal is connected to the complementary readout bit line, and a gate is connected to a complementary bit line;
a control circuit, wherein the control circuit is connected to the third node, a fourth node, a preset voltage terminal, and a first control signal terminal, for responding to a signal of the first control signal terminal to connect the preset voltage terminal to the third node and a fourth node; and
a voltage adjustment circuit, wherein the voltage adjustment circuit is connected to the preset voltage terminal and an adjustment signal terminal, and wherein the voltage adjustment circuit inputs a preset voltage signal to the preset voltage terminal according to an adjustment signal from the adjustment signal terminal.

2. The electronic device according to claim 1,
wherein the adjustment signal terminal comprises a plurality of sub-adjustment signal terminals;
wherein the voltage adjustment circuit comprises:
an operational amplifier, wherein an non-inverting input terminal of the operational amplifier is connected to a reference voltage terminal, wherein an inverting input terminal of the operational amplifier is connected to a fifth node, wherein the fifth node is connected to a ground terminal, and wherein an output terminal of the operational amplifier is connected to the preset voltage terminal;
a first adjustment unit, connected between the fifth node and the output terminal of the operational amplifier, wherein the first adjustment unit comprises:
one or more first resistors, wherein the one or more first resistors is connected in series between the fifth node and the output terminal of the operational amplifier;
a first switch, wherein the first switch is set corresponding to the first resistors, and is also set corresponding to a sub-adjustment signal terminal, wherein a first terminal and a second terminal of the first switch are respectively connected to corresponding first two terminals of the one of the first resistors, and wherein a control terminal of the first switch unit is connected to a corresponding sub-adjustment signal terminal.

3. The electronic device according to claim 1,
wherein the adjustment signal terminal comprises multiple sub-adjustment signal terminals;
wherein the voltage adjustment circuit comprises:
an operational amplifier, wherein an non-inverting input terminal of the operational amplifier is connected to a reference voltage terminal, wherein an inverting input terminal is connected to a fifth node, wherein the fifth node is connected to an output terminal of the operational amplifier, and wherein the output terminal is connected to the preset voltage terminal;
a second adjustment unit, wherein the second adjustment unit is connected between the fifth node and a ground terminal, and wherein the second adjustment unit comprises:

one or more second resistors, wherein the one or more second resistors is connected in series between the fifth node and the ground terminal; and a second switch, wherein the second switch is set corresponding to one of the second resistors, and is also set corresponding to the sub-adjustment signal terminals, wherein a first terminal and a second terminal of the second switch are respectively connected to two terminals of corresponding one of the second resistors, and wherein a control terminal of the second switch is connected to a corresponding one of the sub-adjustment signal terminals.

4. The electronic device according to claim 2, wherein the voltage adjustment circuit further comprises: a second adjustment unit, wherein the second adjustment unit is connected between the fifth node and the ground terminal, and the second adjustment unit comprises:

one or more second resistors, wherein the one or more second resistors is connected in series between the fifth node and the ground terminal;

a second switch, wherein the second switch is set corresponding to one of the second resistors, and is set corresponding to the sub-adjustment signal terminal, wherein a first terminal and a second terminal of the second switch are respectively connected to two terminals of the resistor, wherein a control terminal of the second switch unit is connected to a corresponding sub-adjustment signal terminal;

wherein the one or more first resistors has a same resistance value, or some of the one or more first resistors have different resistance values; and wherein the one or more second resistors has a same resistance value, or some of the one or more second resistors have different resistance values.

5. The electronic device according to claim 4, wherein the one or more first resistors comprises two first resistors, and wherein the one or more second resistors comprises two second resistors.

6. The electronic device according to claim 1, wherein the electronic device further comprises:

a signal generation circuit, wherein the signal generation circuit is connected to the adjustment signal terminal, for inputting the adjustment signal to the adjustment signal terminal according to a preset control signal.

7. The electronic device according to claim 1, wherein the control circuit comprises:

a first transistor, wherein a first terminal of the first transistor is connected to the third node, wherein a second terminal of the first transistor is connected to the preset voltage terminal, and wherein a gate of the first transistor is connected to the first control signal terminal;

a second transistor, wherein a first terminal of the second transistor is connected to the fourth node, and a second terminal of the second transistor is connected to the preset voltage terminal, and a gate of the second transistor is connected to the first control signal terminal;

wherein the first transistor and the second transistor are both N-type transistors or both P-type transistors.

8. The electronic device of claim 1, wherein the sensitivity amplifier further comprises:

a first isolation circuit, wherein the first isolation circuit is connected to the readout bit line, the complementary readout bit line, the third node, the fourth node, and a second control signal terminal, and wherein the first isolation circuit connects the readout bit line and the fourth node, and also connects the complementary readout bit line and the third node in response to a signal from the second control signal terminal.

9. The electronic device of claim 8, wherein the first isolation circuit comprises:

a third transistor, wherein a first terminal of the third transistor is connected to the readout bit line, the second terminal of the third transistor is connected to the fourth node, and a gate of the third transistor is connected to the second control signal terminal; and a fourth transistor, wherein a first terminal of the fourth transistor is connected to the complementary readout bit line, a second terminal of the fourth transistor is connected to the third node, and a gate of the fourth transistor is connected to the second control signal terminal;

wherein the third transistor and the fourth transistor are both N-type transistors or are both P-type transistors.

10. The electronic device of claim 1, wherein the sensitivity amplifier further comprises:

an offset elimination circuit, wherein the offset elimination circuit is connected to the bit line, the complementary bit line, the readout bit line, the complementary readout bit line, and the first control signal terminal, for connecting the bit line in response to the signal from the first control signal terminal and the readout bit line, and wherein the offset elimination circuit connects the complementary bit line and the complementary readout bit line in response to a signal of the first control signal terminal;

a second isolation circuit, wherein the second isolation circuit is connected to the bit line, the complementary bit line, the readout bit line, the complementary readout bit line, and a third control signal terminal, and wherein the second isolation circuit connects the bit line and the third control signal terminal in response to a signal from the third control signal terminal and the complementary readout bit line, and wherein the second isolation circuit connects the complementary bit line and the readout bit line in response to the signal of the third control signal terminal; and a voltage equalizing circuit, wherein the voltage equalizing circuit is connected to the readout bit line, the complementary readout bit line, and a fourth control signal terminal, wherein the voltage equalizing circuit connects the readout bit line and the complementary readout bit line in response to a signal of the fourth control signal terminal.

11. The electronic device of claim 10, wherein the offset elimination circuit comprises:

a fifth transistor, wherein a first terminal of the fifth transistor is connected to the bit line, a second terminal of the fifth transistor is connected to the readout bit line, and a gate of the fifth transistor is connected to the first control signal terminal;

a sixth transistor, wherein a first terminal of the sixth transistor is connected to the complementary bit line, the second terminal of the sixth transistor is connected to the complementary readout bit line, and a gate of the sixth transistor is connected to the first control signal terminal;

wherein the fifth transistor and the sixth transistor are both N-type transistors or are both P-type transistors.

12. The electronic device of claim 10, wherein the second isolation circuit comprises:

a seventh transistor, wherein a first terminal of the seventh transistor is connected to the bit line, a second terminal of the seventh transistor is connected to the complementary readout bit line, and a gate of the seventh transistor is connected to the third control signal terminal;

an eighth transistor, wherein a first terminal of the eighth transistor is connected to the complementary bit line, a second terminal of the eighth transistor is connected to the readout bit line, and a gate of the eighth transistor is connected to the third control signal terminal;

wherein the seventh transistor and the eighth transistor are both N-type transistors or are both P-type transistors.

13. The electronic device according to claim 10, wherein the voltage equalization circuit comprises:

a ninth transistor, wherein a first terminal of the ninth transistor is connected to the readout bit line, a second terminal of the ninth transistor is connected to the complementary readout bit line, and a gate of the ninth transistor is connected to the fourth control signal terminal.

14. The electronic device according to claim 6, wherein the electronic device further comprises:

a programmable fuse circuit, wherein the programmable fuse circuit is connected to the signal generation circuit, and wherein the programmable fuse circuit inputs the preset control signal to the signal generation circuit.

15. The electronic device of claim 14, wherein the electronic device further comprises:

a test signal terminal, wherein the test signal terminal is connected to the signal generation circuit, and wherein the test signal terminal inputs different test control signals to the signal generation circuit during a testing phase.

16. The electronic device according to claim 1, wherein the electronic device is a memory circuit.

17. A method for driving the electronic device, according to claim 15, wherein the method comprises:

in a testing phase, the test signal terminal inputs different control signals to the signal generation circuit, so as to obtain an optimal voltage of the preset voltage terminal; and in a driving phase, the programmable fuse circuit inputs a control signal corresponding to the optimal voltage of the signal generating circuit.

* * * * *